United States Patent
Zannoth

(10) Patent No.: US 9,647,449 B2
(45) Date of Patent: May 9, 2017

(54) INTEGRATED CIRCUIT ARRANGEMENT, METHOD AND SYSTEM FOR USE IN A SAFETY-CRITICAL APPLICATION

(71) Applicant: Infineon Technologies AG, Neubiberg (DE)

(72) Inventor: Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 585 days.

(21) Appl. No.: 14/219,805

(22) Filed: Mar. 19, 2014

(65) Prior Publication Data

US 2014/0285032 A1    Sep. 25, 2014

(30) Foreign Application Priority Data

Mar. 21, 2013 (DE) ......................... 10 2013 004 974

(51) Int. Cl.
| | |
|---|---|
| *H02H 9/00* | (2006.01) |
| *G01R 31/02* | (2006.01) |
| *G01R 19/165* | (2006.01) |

(52) U.S. Cl.
CPC ............ *H02H 9/00* (2013.01); *G01R 31/025* (2013.01); *G01R 19/16576* (2013.01); *Y10T 307/858* (2015.04)

(58) Field of Classification Search
CPC ................................ H02H 9/00; G01R 31/025
(Continued)

(56) References Cited

U.S. PATENT DOCUMENTS 4,139,907 A * 2/1979 Blahut ................. H01L 27/112
257/208
5,343,431 A * 8/1994 Ohtsuka ................... G11C 7/12
365/200
(Continued)

FOREIGN PATENT DOCUMENTS

| CN | 102046442 A | 5/2011 |
|---|---|---|
| DE | 4436372 A1 | 4/1996 |

(Continued)

OTHER PUBLICATIONS

Office Action, in the Chinese language, from counterpart Chinese Application No. 201410105763.2, dated Sep. 1, 2016, 8 pp.

*Primary Examiner* — Viet Q Nguyen
(74) *Attorney, Agent, or Firm* — Shumaker & Sieffert, P.A.

(57) ABSTRACT

An integrated circuit arrangement (100, 200, 600) has a first circuit part (102, 202, 602) which can be supplied with a first supply voltage (106, 206, 606), and a second circuit part (104, 204, 604) which can be supplied with a second supply voltage (108, 208, 608). The first circuit part and the second circuit part are arranged in a manner spatially separate from one another. The first circuit part has a first conduction element (110, 210, 310, 410, 610), and the second circuit part has a second conduction element (112, 212, 312, 412, 612). The integrated circuit arrangement also has a third conduction element (114, 214, 314, 414, 614), the third conduction element being arranged between the first conduction element and the second conduction element in such a manner that the third conduction element is arranged adjacent to the first conduction element and the third conduction element is also arranged adjacent to the second conduction element. The third conduction element can be supplied with a reference potential (116, 216, 616) at a first end, and the third conduction element is connected, at a (Continued)

second end, to an evaluation circuit (118, 218, 618) for detecting a short circuit from the first conduction element to the third conduction element or from the second conduction element to the third conduction element.

20 Claims, 5 Drawing Sheets

(58) Field of Classification Search
 USPC .......................................... 365/201, 206, 226
 See application file for complete search history.

(56) References Cited

U.S. PATENT DOCUMENTS

| | | | |
|---|---|---|---|
| 6,678,132 B1 * | 1/2004 | Carruthers | B60L 3/0023 |
| | | | 361/42 |
| 6,702,405 B1 | 3/2004 | Balz et al. | |
| 2006/0114000 A1 | 6/2006 | Scholl et al. | |
| 2007/0080704 A1 * | 4/2007 | Park | G01R 31/2853 |
| | | | 324/762.02 |
| 2008/0313746 A1 * | 12/2008 | Doi | G06F 21/75 |
| | | | 726/34 |
| 2009/0080261 A1 * | 3/2009 | Fujita | G11C 5/147 |
| | | | 365/185.18 |
| 2011/0098899 A1 | 4/2011 | Fuchs et al. | |
| 2011/0192211 A1 * | 8/2011 | Yokoi | G01N 27/4163 |
| | | | 73/1.06 |

FOREIGN PATENT DOCUMENTS

| | | |
|---|---|---|
| DE | 10150377 A1 | 4/2003 |
| DE | 102008019673 A1 | 10/2009 |
| DE | 102008002154 A1 | 12/2009 |

* cited by examiner

INTEGRATED CIRCUIT ARRANGEMENT, METHOD AND SYSTEM FOR USE IN A SAFETY-CRITICAL APPLICATION

This application claims priority to German Application Serial No. 102013004974.1, filed Mar. 21, 2013, the entire content of which is incorporated herein by reference.

The present invention relates to an integrated circuit arrangement and to a method and a system for use in a safety-critical application.

Integrated circuit arrangements are being increasingly used in safety-critical applications. For example, the number of semiconductor modules containing an integrated circuit arrangement is continuously increasing in motor vehicles. Failure of the integrated circuit arrangement in a motor vehicle may signify a significant risk to humans and the environment. Therefore, in such safety-critical applications, a particularly high degree of importance is attached to reliable and safe operation of the integrated circuit arrangement.

The invention is based on the object of providing an integrated circuit arrangement, a method and a system which can be implemented in a space-efficient manner and are suitable for use in a safety-critical application.

The object is achieved by means of an integrated circuit arrangement according to claim 1, a method according to claim 11 and a system for use in a safety-critical application according to claim 15.

The integrated circuit arrangement has a first circuit part which can be supplied with a first supply voltage, and a second circuit part which can be supplied with a second supply voltage. The first circuit part and the second circuit part are arranged in a manner spatially separate from one another. The first circuit part has a first conduction element, and the second circuit part has a second conduction element. The integrated circuit arrangement also has a third conduction element, the third conduction element being arranged between the first conduction element and the second conduction element in such a manner that the third conduction element is arranged adjacent to the first conduction element and the third conduction element is also arranged adjacent to the second conduction element. The third conduction element can be supplied with a reference potential at a first end, and the third conduction element is connected, at a second end, to an evaluation circuit for detecting a short circuit from the first conduction element to the third conduction element or from the second conduction element to the third conduction element.

The system for use in a safety-critical application has a circuit part to be protected and an integrated circuit arrangement as described in the previous section. The second conduction element of the integrated circuit arrangement is electrically coupled to the circuit part to be protected.

The method comprises applying a first voltage to a first conduction element, applying a second voltage to a second conduction element, and applying a reference potential to a first end of a third conduction element. The third conduction element is arranged between the first conduction element and the second conduction element in such a manner that the third conduction element is arranged adjacent to the first conduction element and the third conduction element is also arranged adjacent to the second conduction element. The first conduction element, the second conduction element and the third conduction element are formed in an integrated semiconductor module. The method also comprises evaluating a voltage at a second end of the third conduction element, and detecting a short circuit from the first conduction element to the third conduction element or from the second conduction element to the third conduction element. The method also comprises changing a system to a safe state, the system having the integrated semiconductor module.

A sleeping fault is detected in good time inside the integrated circuit arrangement, inside the system and inside the integrated semiconductor module, namely before a short circuit occurs between the first conduction element and the second conduction element. For example, a sleeping fault is detected as soon as a short circuit from the first conduction element to the third conduction element occurs. Destruction of the third conduction element, whose function or purpose is restricted to the detection of a sleeping fault, which is caused by the short circuit, does not influence the proper operation of the integrated circuit arrangement, the system and the integrated semiconductor module. In contrast, destruction of the second conduction element or a circuit connected to the second conduction element results in a malfunction or failure of the integrated circuit arrangement, the system and the integrated semiconductor module. On account of the fact that the sleeping fault is detected in good time, it is possible to prevent the second conduction element or the circuit connected to the second conduction element from being destroyed on account of the short circuit with the first conduction element. Safe operation of the integrated circuit arrangement, the system and the integrated semiconductor module is ensured with only a small amount of space.

Different refinements and developments of the invention are stated in the dependent patent claims.

In one refinement of the integrated circuit arrangement, the first supply voltage is in a range which is above a voltage range for which a circuit part, which can be electrically coupled to the second conduction element and is to be protected, is designed.

In one refinement of the integrated circuit arrangement, the evaluation circuit is designed in such a manner that, in order to detect the short circuit, a voltage applied to the third conduction element is compared with at least one predefined threshold value.

In one refinement of the integrated circuit arrangement, no electrical connection exists between the evaluation circuit and the first conduction element and between the evaluation circuit and the second conduction element if the short circuit is not present.

In one refinement of the integrated circuit arrangement, the first conduction element, the second conduction element and the third conduction element are arranged parallel to one another inside a conductor track plane.

In one refinement of the integrated circuit arrangement, the first conduction element is arranged directly adjacent to the third conduction element and no functional element is arranged between the first conduction element and the third conduction element. The second conduction element is also arranged directly adjacent to the third conduction element and no functional element is arranged between the second conduction element and the third conduction element.

In one refinement of the integrated circuit arrangement, the third conduction element is arranged in a conductor track plane above the first conduction element, and the second conduction element is arranged in a conductor track plane above the third conduction element.

In one refinement of the integrated circuit arrangement, a distance between the first conduction element and the third conduction element corresponds to a minimum distance between two adjacent conduction elements, and a distance between the second conduction element and the third conduction element likewise corresponds to the minimum distance between two adjacent conduction elements.

In one refinement of the integrated circuit arrangement, a width of the third conduction element corresponds to a minimum width of a conduction element.

In one development of the integrated circuit arrangement, the evaluation circuit is also designed to detect an interruption inside the third conduction element.

In one refinement of the system, the system is designed in such a manner that it is changed to a safe state upon detection of the short circuit.

In one refinement of the system, the system is designed in such a manner that destruction of the circuit part to be protected is prevented upon detection of the short circuit.

In one refinement of the system, the safety-critical application comprises an application in a vehicle, and the system is designed in such a manner that failure of an airbag, a brake or a steering system is prevented upon detection of the short circuit.

In one refinement of the system, the first conduction element of the integrated circuit arrangement is electrically coupled to an engine control circuit, and the circuit part to be protected has a microcontroller.

In one refinement of the system, the integrated circuit arrangement and the circuit part to be protected are formed in a common integrated semiconductor module.

In one refinement of the method, the process of evaluating the voltage comprises comparing the voltage with at least one predefined threshold value.

In one refinement of the method, the process of changing the system to the safe state comprises switching off the integrated semiconductor module.

In one refinement of the method, the process of changing the system to the safe state comprises generating a warning signal.

Exemplary embodiments are explained in more detail below with reference to the accompanying figures. The digit(s) of the reference symbols furthest to the left denote(s) the figure in which the reference symbol is used for the first time. The use of identical or similar reference symbols in the description and in the figures indicates identical or similar elements. The invention is not restricted to the specifically described embodiments but rather can be modified and varied in a suitable manner. It is within the scope of the invention to suitably combine individual features and combinations of features of one embodiment with features and combinations of features of another embodiment in order to arrive at further embodiments. Within the scope of the description and the patent claims, the terms "coupled" and "connected" relate both to direct and to indirect connections between circuit elements, that is to say also to connections through interposed circuits.

Figure 1:
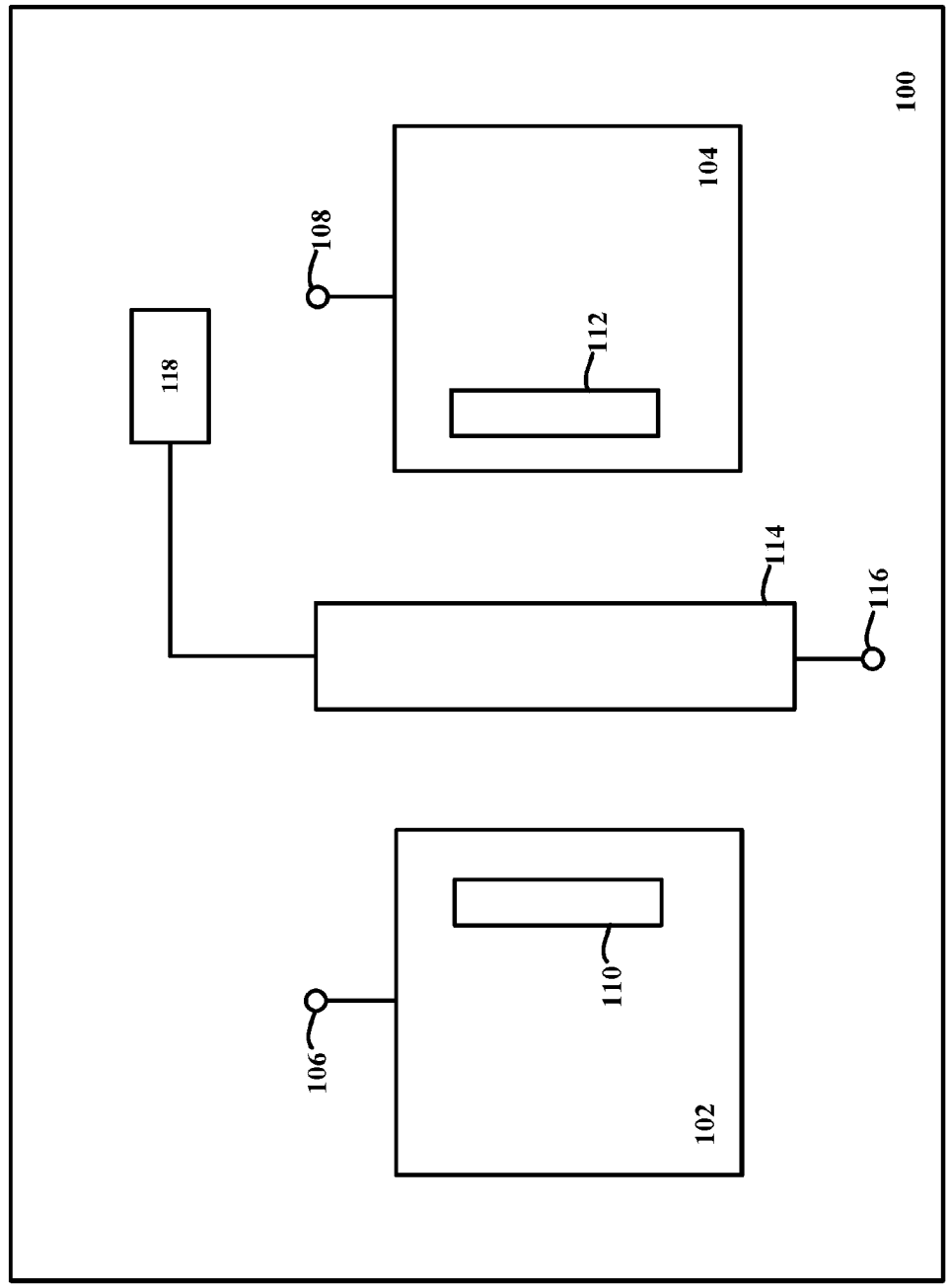
FIG. 1 shows a schematic illustration of one embodiment of the integrated circuit arrangement.

FIG. 1 shows a schematic illustration of one embodiment of the integrated circuit arrangement. The integrated circuit arrangement 100 has a first circuit part 102 and a second circuit part 104. The first circuit part 102 can be supplied with a first supply voltage 106, that is to say the first circuit part 102 is operated with a first supply voltage 106. The second circuit part 104 can be supplied with a second supply voltage 108, that is to say the second circuit part 104 is operated with a second supply voltage 108. Inside the integrated circuit arrangement 100, the first circuit part 102 is arranged in a manner spatially separate from the second circuit part 104.

The first circuit part 102 has a first conduction element 110 and the second circuit part 104 has a second conduction element 112. The circuit arrangement 100 also has a third conduction element 114 which is arranged between the first conduction element 110 and the second conduction element 114. In this case, the third conduction element 114 is arranged both adjacent to the first conduction element 110 and adjacent to the second conduction element 112.

The third conduction element 114 can be supplied with a reference potential 116 at a first end. The third conduction element 114 is connected to an evaluation circuit 118 at a second end. The evaluation circuit 118 detects a short circuit from the first conduction element 110 to the third conduction element 114 or a short circuit from the second conduction element 112 to the third conduction element 114.

Inside the integrated circuit arrangement 100, the evaluation circuit 118 detects a short circuit which starts from the first conduction element 110 or from the second conduction element 112. Detection is effected as soon as a short circuit occurs between the first conduction element 110 and the third conduction element 114 or a short circuit occurs between the second conduction element 112 and the third conduction element 114. As a result of the fact that the third conduction element 114 is arranged between the first conduction element 110 and the second conduction element 112, a short circuit starting from the first conduction element 110 or from the second conduction element 112 is detected even before a short circuit occurs between the first conduction element 110 and the second conduction element 112. The short circuit is detected with the aid of the third conduction element 114 and the evaluation circuit 118.

The first circuit part 102 is supplied with a first voltage 106 and the second circuit part 104 is supplied with a second voltage 108. In one embodiment, the first voltage 106 is in a first voltage range which is above a second voltage range in which the second voltage 108 lies. In this case, the first voltage range is above the second voltage range such that a short circuit from the first conduction element 110 to the second conduction element 112 results in destruction of the second conduction element 112 or destruction of a circuit connected to the second conduction element 112.

The first circuit part 102 and the second circuit part 104 are arranged in a manner spatially separate from one another and cover different functions inside the integrated circuit arrangement 100. The first circuit part 102 is, for example, a high-voltage circuit part which is operated with a first supply voltage 106 of several 10 V. In one embodiment, the first circuit part 102 is operated at 60 V and 60 V are applied to the first conduction element 110. The second circuit part 104 is, for example, a low-voltage circuit part which is operated with a second supply voltage 108 of a few V. In one embodiment, the second circuit part 104 is a digital block which is operated with a voltage of 1.5 V and 1.5 V are applied to the second conduction element 112. The signals applied to the first conduction element 110 and to the second conduction element 112 are two signals which are independent of one another. The second conduction element 112 or a circuit connected to the second conduction element 112 is designed for a tolerance range of 1.2 V-1.65 V, where the second conduction element 112 or a circuit connected to the latter is destroyed as of 2.3 V. The voltage of 60 V applied to the first conduction element 110 is above the tolerance range of the second conduction element 112 or of the circuit connected to the second conduction element 112. The occurrence of a short circuit from the first conduction element 110 to the second conduction element 112 results in destruction of the second conduction element 112 or of the circuit connected to the second conduction element 112.

A short circuit is caused, for example, by a conductive particle which remains in the integrated circuit arrangement during production. The conductive particle is not detected during a test which is carried out before delivering the integrated circuit arrangement on account of its small size. The conductive particle is therefore initially an undetected sleeping fault. On account of different influences, for example ageing, temperature, moisture or corrosion, the conductive particle increases in size over time and may then cause a short circuit between lines. The undetected sleeping fault causes a module which contains the integrated circuit arrangement and is initially delivered to a customer without faults to have a defect within a normal operating period. An undetected sleeping fault can also be caused, for example, during production by incorrect processing during chemical mechanical polishing (referred to as "CMP" in abbreviated form).

A conductive particle is located inside the integrated circuit arrangement 100, for example in the region of the first conduction element 110. On account of its small size, the conductive particle is not immediately detected after production of the integrated circuit arrangement 100 and the integrated circuit arrangement 100 is completely functional. The conductive particle increases in size over time until it makes contact with both the first conduction element 110 and the third conduction element 114. Contact between the conductive particle and the first conduction element 110 and the third conduction element 114 produces a short circuit between the first conduction element 110 and the third conduction element 114, and the short circuit is detected by the evaluation circuit 118. The conductive particle is therefore detected even before a short circuit can occur between the first conduction element 110 and second conduction element 112.

Inside the integrated circuit arrangement 100, a sleeping fault, for example a conductive particle, is uncovered in good time. The sleeping fault is uncovered as soon as a short circuit from the first conduction element 110 to the third conduction element 114 or from the second conduction element 112 to the third conduction element 114 occurs. The sleeping fault is therefore detected even before a short circuit occurs between the first conduction element 110 and the second conduction element 112. The sleeping fault is detected at a time in which the integrated circuit arrangement 100 is still completely functional, that is to say before a hazard in the integrated circuit arrangement 100 occurs. For example, the sleeping fault is detected before the second conduction element 112 or a circuit connected to the second conduction element 112 is destroyed on account of the short circuit. A "hazard" is therefore prevented.

The third conduction element 114, which can also be referred to as a sensor element or detector element, and the evaluation circuit 118 are used to detect a sleeping fault and therefore to ensure the functional safety of the integrated circuit arrangement 100. Since the third conduction element 114 and the evaluation circuit 118 have a low area requirement, it is possible to ensure the functional safety in an efficient manner inside the integrated circuit arrangement 100.

The third conduction element 114 is dedicated to detecting the sleeping fault. In other words, the third conduction element 114 does not undertake any function during normal operation of the integrated circuit arrangement 100. For example, the third conduction element 114 is not involved in any logical operation of the integrated circuit arrangement 100. During normal operation of the integrated circuit arrangement 100, that is to say when a short circuit is not present, there is no electrical connection between the third conduction element 114 and the functional elements of the integrated circuit arrangement 100. For example, there is no electrical connection between the third conduction element 114 and the first conduction element 110 or between the third conduction element 114 and the second conduction element 112. There is likewise no electrical connection between the first conduction element 110 and the evaluation circuit 118 and between the second conduction element 112 and the evaluation circuit 118.

Figure 2:
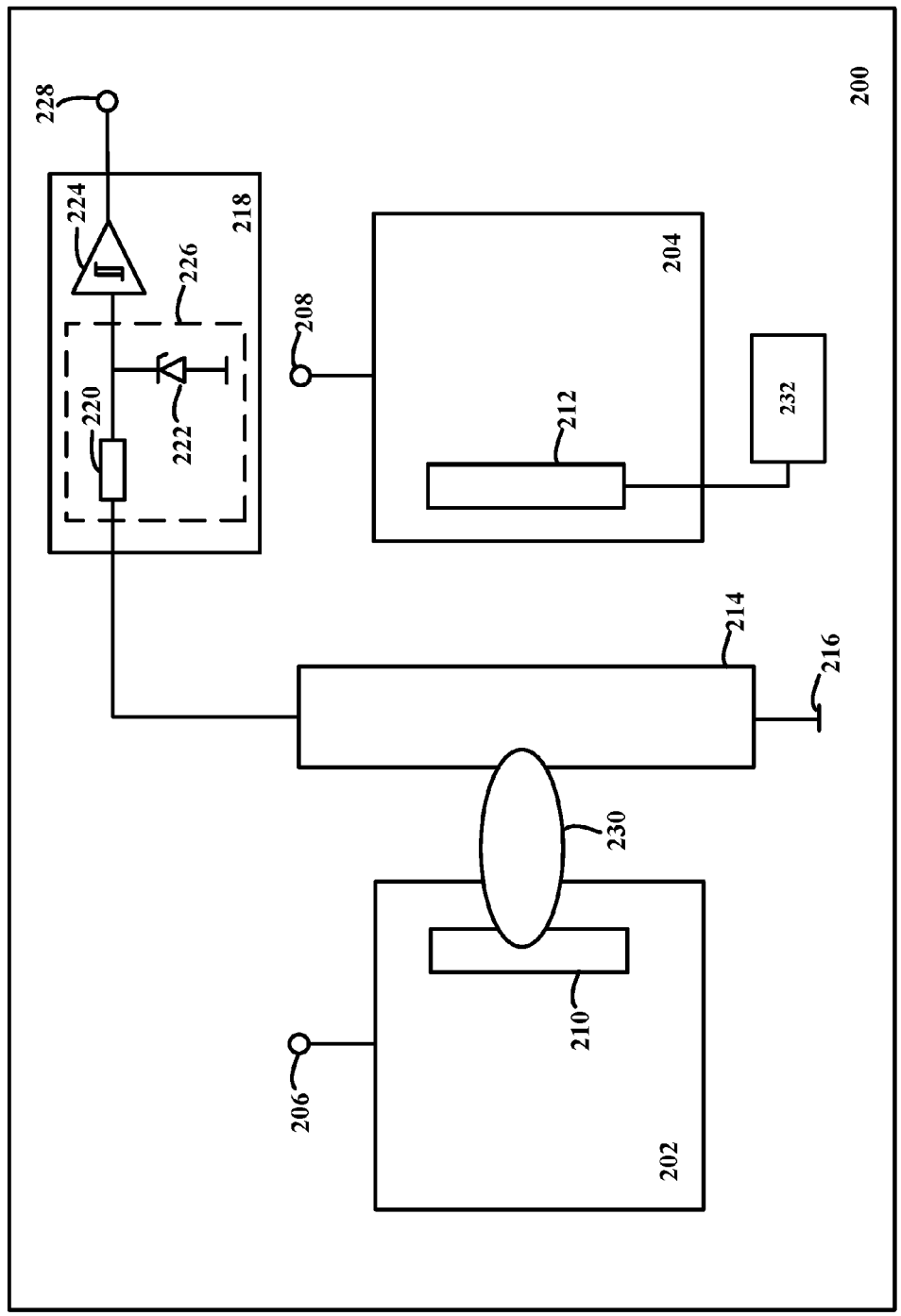
FIG. 2 shows a schematic illustration of another embodiment of the integrated circuit arrangement.

FIG. 2 shows a schematic illustration of another embodiment of the integrated circuit arrangement. Like in the embodiment illustrated and described with reference to FIG. 1, the integrated circuit arrangement 200 has a first circuit part 202 with a first conduction element 210, a second circuit part 204 with a second conduction element 212, a third conduction element 214 and an evaluation circuit 218. The first circuit part 202 is operated with a first supply voltage 206 and the second circuit part 204 is operated with a second supply voltage 208.

The first conduction element 210 is, for example, part of a supply voltage line to which a voltage of 60 V is applied. The second conduction element 212 is, for example, part of a signal line to which a voltage of 1.5 V is applied. The third conduction element 214 is connected to a ground potential 216 at a first end and is connected to an input of an evaluation circuit 218 at a second end.

The evaluation circuit 218 has a series resistor 220, a Zener diode 222 and a comparator 224. A first connection of the series resistor 220 is connected to the input of the evaluation circuit 218 and a second connection of the series resistor 220 is connected to a first connection of the Zener diode 222 and to an input of the comparator 224. A second connection of the Zener diode 222 is connected to a ground potential.

A voltage applied to the input of the evaluation circuit 218 is limited using the series resistor 220 and the Zener diode 222. The voltage applied to the input of the evaluation circuit 218 is limited to a clamping voltage of the Zener diode 222 using the series resistor 220 and the Zener diode 222 and destruction of the comparator 224 on account of overvoltage is therefore prevented. The series resistor 220 and the Zener diode 222 together form an overvoltage protective circuit or a clamping circuit 226.

The comparator 224 compares the voltage applied to its input with a predefined threshold value or a predefined threshold voltage. The comparator 224 therefore carries out a voltage measurement and outputs, at an output, an output signal 228 which indicates whether the input voltage is above or below the predefined threshold voltage. The output signal from the comparator 224 corresponds to an output signal at an output of the evaluation circuit 218. In one embodiment, as illustrated in FIG. 2, the comparator 224 is in the form of a comparator with switching hysteresis and is therefore in the form of a Schmitt trigger.

As illustrated in FIG. 2, the integrated circuit arrangement 200 also has a conductive particle 230 which is situated in the region of the first conduction element 210. The conductive particle 230 is so large that a short circuit occurs between the first conduction element 210 and the third conduction element 214 via the conductive particle 230. The voltage of 60 V applied to the first conduction element 210 is therefore also applied to the third conduction element 214 and to the input of the evaluation circuit 218. The third conduction element 214 fuses on account of the applied voltage and is destroyed or interrupted. The clamping circuit 226 limits the voltage applied to the input of the evaluation circuit 218 to a clamping voltage of 10 V, for example. In the Schmitt trigger, the voltage of 10 V limited by the clamping circuit 226 is compared with a predefined threshold value of 3 V, for example. Since the voltage of 10 V limited by the clamping circuit 226 is above the predefined threshold value of 3 V, the Schmitt trigger 224 outputs, at its output, the output signal 228 which indicates that a short circuit has occurred. The output signal 228 is also present at an output of the evaluation circuit 218.

Inside the integrated circuit arrangement 200, the short circuit from the first conduction element 210 to the third conduction element 214 is detected with the aid of the third conduction element 214 and the evaluation circuit 218 and is indicated by the output signal 228 even before a short circuit occurs between the first conduction element 210 and the second conduction element 212. As a result of the detection in good time, it is possible to prevent a short circuit from occurring between the first conduction element 210 and the second conduction element 212. It is also possible to prevent the voltage of 60 V from the first conduction element 212 from being applied to a circuit part 232 which is electrically connected to the second conduction element 212 inside the integrated circuit arrangement 200. The circuit part 232, which can also be referred to as a circuit part to be protected, is designed for a voltage of at most 1.65 V, for example. A voltage of 60 V would result in destruction of the circuit part 232 to be protected.

In one embodiment, instead of the conductive particle 230 illustrated and described in FIG. 2, a conductive particle occurs in the region of the second conduction element 212. The conductive particle initially has contact only with the second conduction element 212. The conductive particle increases in size over time, for example on account of corrosion, until a short circuit occurs between the second conduction element 212 and the third conduction element 214 via the conductive particle. Since only a voltage of 1.5 V is applied to the second conduction element 212, the short circuit does not result in destruction of the third conduction element 214.

In another embodiment, the voltage applied to the second conduction element 212 is so high that, in the event of a short circuit, the third conduction element 214 is destroyed, in a manner similar to that described above with reference to the first conduction element 210.

In the embodiment illustrated and described in FIG. 2, the first end of the third conduction element 214 is directly connected to a ground potential 216. In another embodiment, the first end of the third conduction element 214 is connected to the ground potential 216 via a resistor. The resistor is dimensioned, for example, in such a manner that, in the event of a short circuit from the first conduction element 210 to the third conduction element 214 or in the event of a short circuit from the second conduction element 212 to the third conduction element 214, the voltage is increased at the input of the evaluation circuit 218, which increase can be detected by the evaluation circuit 218.

In another embodiment, the first end of the third conduction element 214 is connected to a reference potential 216 which differs from the ground potential. For example, the first end of the third conduction element 214 is connected to a reference potential 216 of 2.5 V via a resistor. A comparison with two predefined threshold values takes place in the evaluation circuit 218. For example, a comparison in order to determine whether the voltage limited by the clamping circuit 226 is above a first predefined threshold value of 3 V is carried out in the evaluation circuit 218. In addition, a comparison in order to determine whether the voltage limited by the clamping circuit 226 is below a second predefined threshold value of 2 V is carried out in the evaluation circuit 218. In addition to detecting a short circuit from the first conduction element 210 to the third conduction element 214, the comparison with two predefined threshold values inside the evaluation circuit 218 also makes it possible to detect a short circuit from the second conduction element 212 to the third conduction element 214. In addition, it is also possible to detect an interruption inside the third conduction element 214 with the aid of the evaluation circuit 218. The interruption is caused, for example, by a tear, a break or by corrosion.

Figure 3:
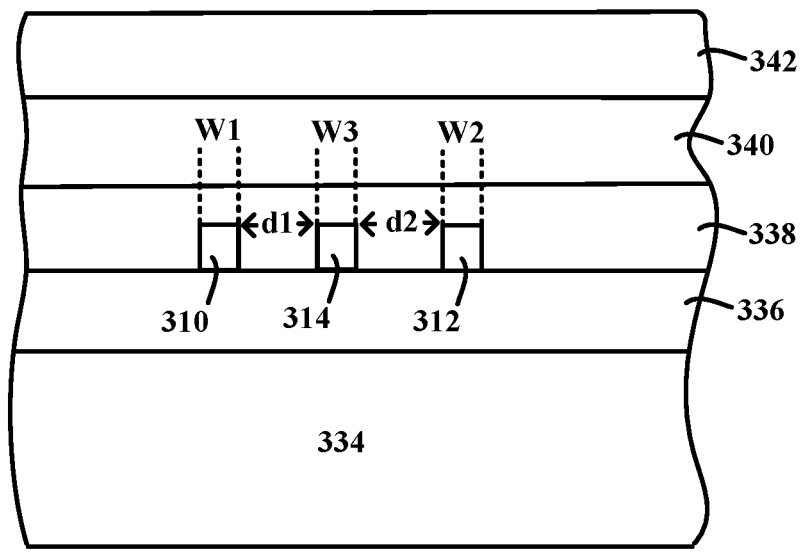
FIG. 3 shows a schematic illustration of a cross section of a semiconductor module.

FIG. 3 shows a schematic illustration of a cross section of a semiconductor module. FIG. 3 shows, for example, a cross section through a section of the embodiments illustrated and described with reference to FIG. 1 and FIG. 2. A first conductor track plane 336 containing an electrically non-conductive material as the dielectric is formed on a semiconductor substrate 334. The first conductor track plane 336 may contain electrically conductive regions (not illustrated), for example made of polysilicon. A second conductor track plane 338 which is formed above the first conductor track plane 336 likewise contains an electrically non-conductive material. Furthermore, a first conduction element 310, a second conduction element 312 and a third conduction element 314 are formed in the second conductor track plane 338. The first conduction element 310, the second conduction element 312 and the third conduction element 314 correspond, for example, to the conductor track elements 110, 112, 114, 210, 212 and 214 illustrated and described with reference to FIG. 1 and FIG. 2. The second conductor track plane 338 is a metal plane, for example, the first conduction element 310, the second conduction element 312 and the third conduction element 314 being formed from an electrically conductive material, for example aluminum or copper. The third conduction element 314 is produced in the same production step as the first conduction element 310 and the second conduction element 312. A third conductor track plane 340 is formed above the second conductor track plane 338, and a fourth conductor track plane 342 is formed above the third conductor track plane 340. Like in the second conductor track plane 338, conductor tracks (not illustrated) may also be formed in the third conductor track plane 340 and in the fourth conductor track plane 342. Polysilicon regions of the first conductor track plane 336 may be connected to conductor tracks of the second conductor track plane 338 via plated-through holes. Conductor tracks of the second conductor track plane 338 may likewise be connected to conductor tracks of the third conductor track plane 340 and conductor tracks of the third conductor track plane 340 may be connected to conductor tracks of the fourth conductor track plane 342 via plated-through holes.

As illustrated and described with reference to FIG. 1 and FIG. 2, the first conduction element 310, the second conduction element 312 and the third conduction element 314 run parallel to one another inside the second conductor track plane 338. In one embodiment, a distance d1 between the first conduction element 310 and the third conduction element 314 corresponds to a minimum distance which can be produced between two adjacent conduction elements in a particular technology on account of restrictions in the production process. A distance d2 between the second conduction element 312 and the third conduction element 314 likewise corresponds to the minimum distance. In another embodiment, the distances d1 and d2 are greater than the minimum distance and/or the distances d1 and d2 differ from one another.

In one embodiment, the first conduction element 310 is arranged directly adjacent to the third conduction element 314 and the second conduction element 312 is also arranged directly adjacent to the third conduction element 314. There is no functional element between the first conduction element 310 and the third conduction element 314 and there is no functional element either between the second conduction element 312 and the third conduction element 314. In another embodiment, filling structures are arranged between the first conduction element 310 and the third conduction element 314, for example. Filling structures are likewise arranged between the second conduction element 312 and the third conduction element 314. The filling structures are at least partially formed in the semiconductor substrate 334, for example.

In one embodiment, a width w1 of the first conduction element 310 corresponds to a minimum width which can be produced in a particular technology on account of restrictions in the production process. A width w2 of the second conduction element 312 and a width w3 of the third conduction element 314 likewise correspond to the minimum width. In another embodiment, the widths w1, w2 and w3 are greater than the minimum width and/or the widths w1, w2 and w3 differ from one another.

Figure 4:
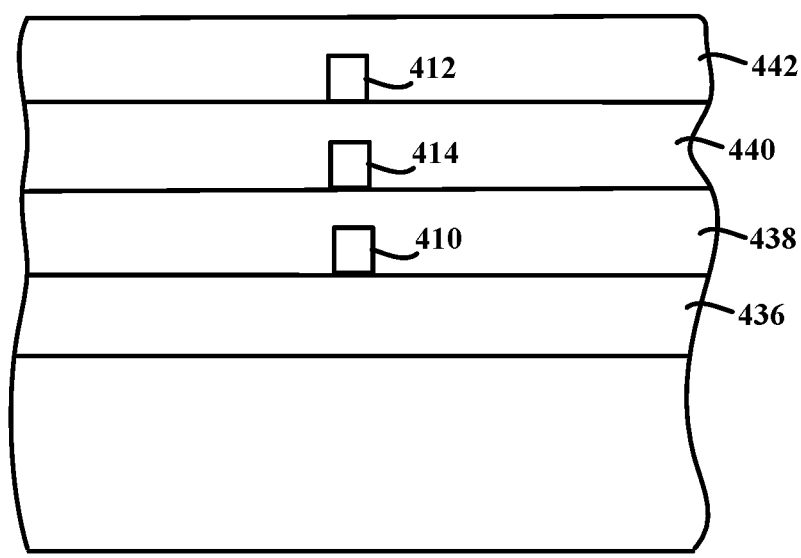
FIG. 4 shows a schematic illustration of a further cross section of a semiconductor module.

In the embodiment illustrated and described in FIG. 3, the first conduction element 310, the second conduction element 312 and the third conduction element 314 are arranged in the second conductor track plane 338. In another embodiment, the first conduction element 310, the second conduction element 312 and the third conduction element 314 are arranged in a different conductor track plane. In another embodiment, the first conduction element 310, the second conduction element 312 and the third conduction element 314 are situated in different conductor track planes. For example, in an embodiment illustrated in FIG. 4, a third conductor track element 414 is arranged in a third conductor track plane 440 which is directly above a second conductor track plane 438 in which a first conductor track element 410 is arranged. Furthermore, a second conductor track element 412 is arranged in a fourth conductor track plane 442 which is directly above the third conductor track plane 440. In one embodiment, as illustrated in FIG. 4, the first conductor track element 410, the second conductor track element 412 and the third conductor track element 414 run parallel to one another and are arranged directly above one another. In another embodiment, the first conductor track element 410 arranged in the second conductor track plane 438 and the second conductor track element 412 arranged in the fourth conductor track plane 442 cross.

Figure 5:
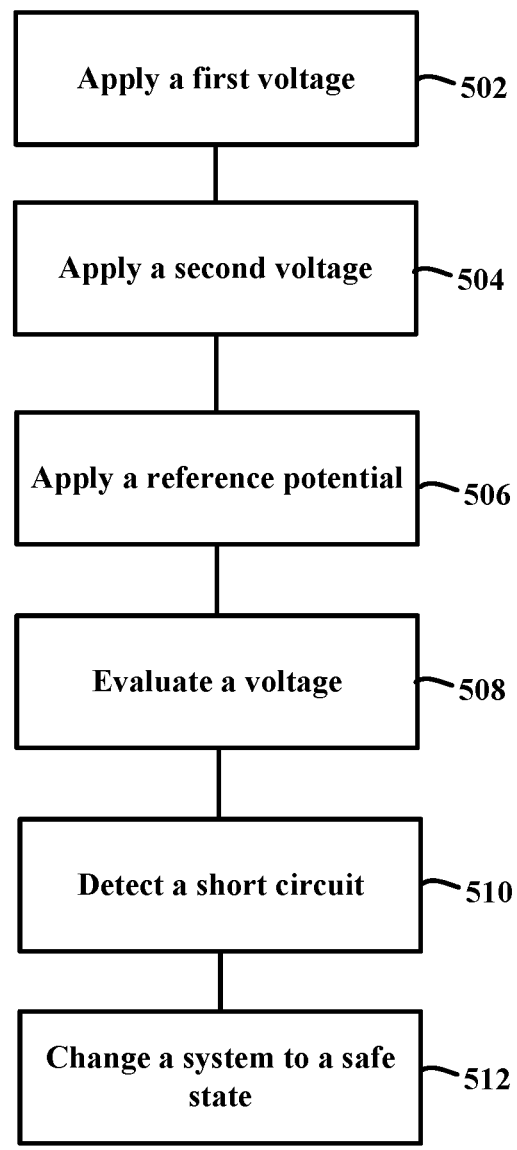
FIG. 5 shows a flowchart of a method.

FIG. 5 shows a flowchart of a method 500.

In 502, a first voltage is applied to a first conduction element.

In 504, a second voltage is applied to a second conduction element.

In 506, a reference potential is applied to a first end of a third conduction element. The third conduction element is arranged between the first conduction element and the second conduction element in such a manner that the third conduction element is arranged adjacent to the first conduction element and the third conduction element is also arranged adjacent to the second conduction element. The first conduction element, the second conduction element and the third conduction element are formed in an integrated semiconductor module.

In 508, a voltage at a second end of the third conduction element is evaluated.

In 510, a short circuit from the first conduction element to the third conduction element or from the second conduction element to the third conduction element is detected.

In 512, a system is changed to a safe state, the system having the integrated semiconductor module.

In one refinement of the method 500, the process of evaluating the voltage comprises comparing the voltage with at least one predefined threshold value.

In another refinement of the method 500, the process of changing the system to the safe state comprises switching off the integrated semiconductor module.

In another refinement of the method 500, the process of changing the system to the safe state comprises generating a warning signal.

In 502, a first voltage which is in the range of a few 10 V is applied to the first conduction element, for example. In 504, a second voltage which is in the range of a few V is applied to the second conduction element, for example. When evaluating the voltage in 508, the voltage applied to the second end of the third conduction element, for example, is compared with a predefined threshold value. In one embodiment, the predefined threshold value and the reference potential at the first end of the third conduction element are selected in such a manner that both a short circuit from the first conduction element to the third conduction element and a short circuit from the second conduction element to the third conduction element can be detected. In another embodiment, an interruption which was caused by a tear, for example, can also be detected inside a third conduction element.

During normal operation of the integrated semiconductor module, no logical function is assigned to the third conduction element, that is to say no signal is transmitted via the third conduction element during memory operations or arithmetic operations, for example. Rather, the third conduction element is provided purely for detecting the short circuit, that is to say the function of the third conduction element is restricted to detecting the short circuit. It is arranged in such a manner that a short circuit inside the integrated semiconductor module can be detected in good time, namely before a short circuit occurs between the first conduction element and the second conduction element. As a result of the fact that the short circuit is detected in good time, it is possible to prevent destruction of further circuit parts which are either arranged inside the integrated semiconductor module or are coupled to the integrated semiconductor module.

The sequence of the steps of the method 500 need not correspond to the sequence described above. The method 500 can be carried out using one of the integrated circuit arrangements described in the preceding sections or using a system described in the following sections.

Figure 6:
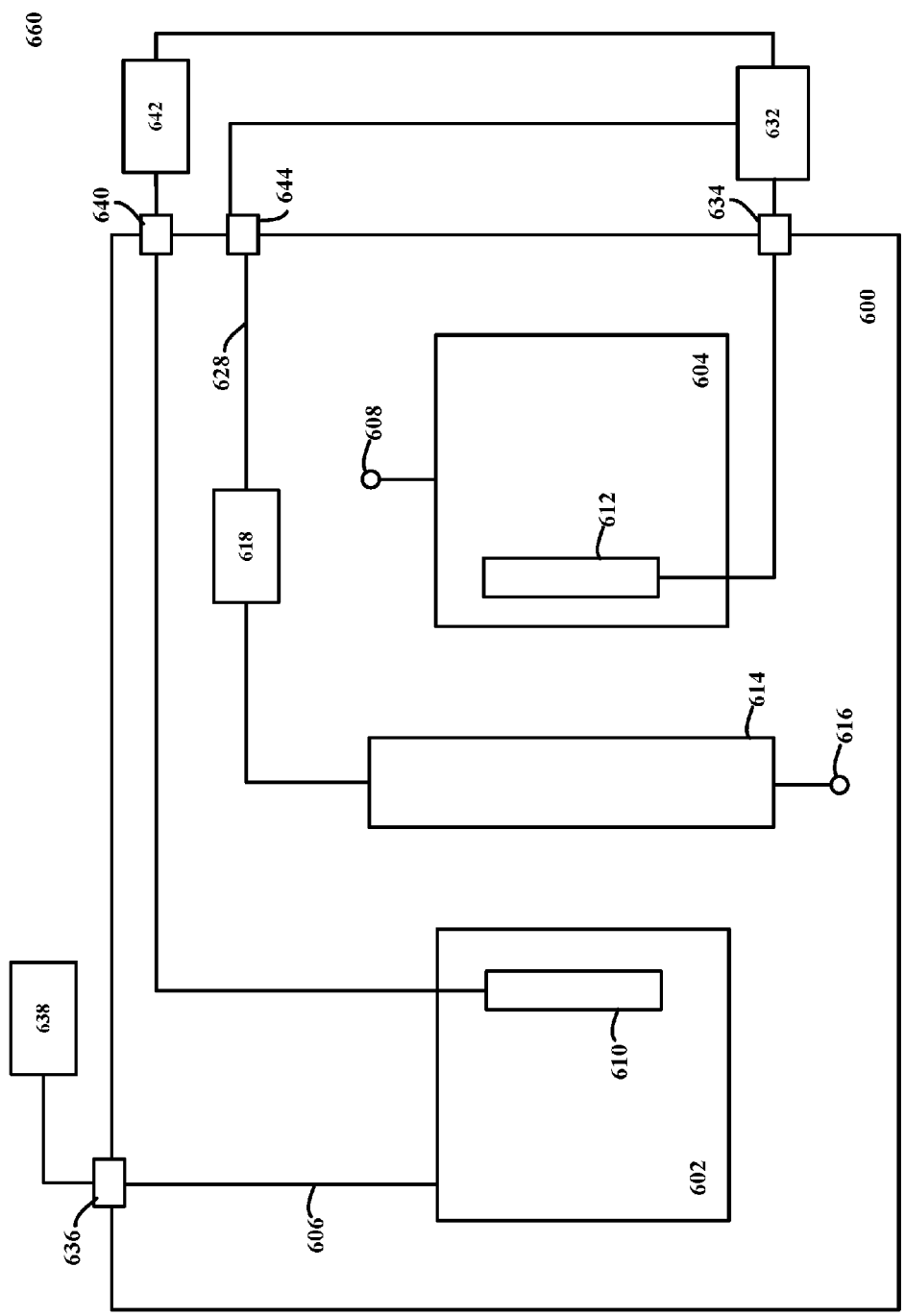
FIG. 6 shows a schematic illustration of a system which is used in a safety-critical application.

FIG. 6 shows a schematic illustration of a system 660 which is used in a safety-critical application. The system 660 has a circuit part 632 to be protected and an integrated circuit arrangement 600 as illustrated and described, by way of example, with reference to FIG. 1-FIG. 4. The integrated circuit arrangement 600 has a first circuit part 602 with a first conduction element 610, a second circuit part 604 with a second conduction element 612, a third conduction element 614 and an evaluation circuit 618. The first circuit part 602 is operated with a first supply voltage 606, and the second circuit part 604 is operated with a second supply voltage 608. In the embodiment illustrated in FIG. 6, the second conduction element 612 is electrically coupled to the circuit part 632 to be protected via a first interface 644. In another embodiment, the circuit part 632 to be protected is arranged inside the integrated circuit arrangement 600 and is electrically connected to the second conduction element 612.

In one embodiment, the safety-critical application is an application in a vehicle, for example in a motor vehicle. The functional safety of the motor vehicle, as required by the ISO 26262 standard, is ensured with the aid of the third conduction element 614 and the evaluation circuit 618. The first circuit part 602 is electrically coupled, via a second interface 636, to a battery or a vehicle electrical system 638 which supplies the first circuit part 602 with the first supply voltage 606 of 48 V, for example. The first conduction element 610 is electrically coupled, via a third interface 640, to an engine controller 642, for example a servomotor for a steering system of the motor vehicle. The output signal 628 from the evaluation circuit 618 is electrically coupled to a control unit 632 via a fourth interface 644. The control unit 632 controls, inter alia, the engine controller 642. In the embodiment illustrated in FIG. 6, the control unit 632 is identical to the circuit part 632 to be protected. The circuit part 632 to be protected or the control unit is in the form of a microcontroller, for example.

The microcontroller 632 receives an indication of a short circuit in good time via the evaluation circuit 618 and the output signal 628 and then changes the system 660 to a safe state. The microcontroller 632 can therefore be referred to as a control unit, on the one hand. On the other hand, the microcontroller 632 which is electrically coupled to the second conduction element 612 and is designed for a voltage of 1.5 V, for example, is responsible for the functionality of the system 660 as the central circuit element. The microcontroller 632 can therefore also be referred to as a circuit part to be protected. In order to prevent complete failure of the system 660, destruction of the microcontroller 632 as a result of a short circuit from the first conduction element 610, to which 48 V are applied, to the second conduction element 612 should be imperatively avoided.

After the microcontroller 632 has received a signal of a short circuit in good time via the output signal 628, it can change the system 660 to a safe state in a controlled manner by switching off the integrated circuit arrangement 600, for example, or causing the generation of a warning signal. The microcontroller 632 can therefore both avoid its own destruction and prevent failure of the system 660. Consequently, uncontrolled or faulty behavior of the steering system, which is controlled using the servomotor 642, can be prevented, for example.

In the embodiment illustrated and described with reference to FIG. 6, the system 660 is used in a motor vehicle in order to prevent faulty behavior of a steering system. In another embodiment, the system is provided for the purpose of preventing failure of further safety-critical components of a motor vehicle, for example failure of an airbag, a brake or an anti-lock braking system.

In addition to a motor vehicle, there are further safety-critical applications in which the system 660 can be used. For example, the system 660 can be used in medical technology, in a reactor controller, in a traffic guidance system or in other vehicles, for instance in an aircraft.

The invention claimed is:

1. An integrated circuit arrangement comprising:
a first circuit part which can be supplied with a first supply voltage,
a second circuit part which can be supplied with a second supply voltage,
the first circuit part and the second circuit part being arranged in a manner spatially separate from one another,
the first circuit part having a first conduction element,
the second circuit part having a second conduction element, and
a third conduction element, the third conduction element being electrically-isolated from and arranged between the first conduction element and the second conduction element in such a manner that the third conduction element is arranged adjacent to the first conduction element and the third conduction element is also arranged adjacent to the second conduction element, the third conduction element being able to be supplied with a reference potential at a first end, and the third conduction element being connected, at a second end, to an evaluation circuit that is electrically-isolated from the first conduction element and from the second conduction element for detecting a short circuit from the first conduction element to the third conduction element or from the second conduction element to the third conduction element.

2. The integrated circuit arrangement as claimed in claim 1, the first supply voltage being in a range which is above a voltage range for which a circuit part, which can be electrically coupled to the second conduction element and is to be protected, is designed.

3. The integrated circuit arrangement of claim 1, the evaluation circuit being designed in such a manner that, in order to detect the short circuit, a voltage applied to the third conduction element is compared with at least one predefined threshold value.

4. The integrated circuit arrangement of claim 1, no electrical connection existing between the evaluation circuit and the first conduction element and between the evaluation circuit and the second conduction element if the short circuit is not present.

5. The integrated circuit arrangement of claim 1, the first conduction element, the second conduction element and the third conduction element being arranged parallel to one another inside a conductor track plane.

6. The integrated circuit arrangement of claim 1, the first conduction element being arranged directly adjacent to the third conduction element and no functional element being arranged between the first conduction element and the third conduction element, and the second conduction element also being arranged directly adjacent to the third conduction element and no functional element being arranged between the second conduction element and the third conduction element.

7. The integrated circuit arrangement of claim 1, the third conduction element being arranged in a conductor track plane above the first conduction element, and the second conduction element being arranged in a conductor track plane above the third conduction element.

8. The integrated circuit arrangement of claim 1, wherein a distance (d1) between the first conduction element and the third conduction element corresponds to a minimum distance between two adjacent conduction elements, and wherein a distance (d2) between the second conduction element and the third conduction element likewise corresponds to the minimum distance between two adjacent conduction elements.

9. The integrated circuit arrangement of claim 1, a width (w3) of the third conduction element corresponding to a minimum width of a conduction element.

10. The integrated circuit arrangement of claim 1, the evaluation circuit also being designed to detect an interruption inside the third conduction element.

11. A method comprising:
applying a first voltage to a first conduction element,
applying a second voltage to a second conduction element,
applying a reference potential to a first end of a third conduction element,
the third conduction element being electrically-isolated from and arranged between the first conduction element and the second conduction element in such a manner that the third conduction element is arranged adjacent to the first conduction element and the third conduction element is also arranged adjacent to the second conduction element,
the first conduction element, the second conduction element and the third conduction element being formed in an integrated semiconductor module,
evaluating a voltage at a second end of the third conduction element using an evaluation circuit that is electrically-isolated from the first conduction element and from the second conduction element,
detecting a short circuit from the first conduction element to the third conduction element or from the second conduction element to the third conduction element, and
changing a system to a safe state, the system including the integrated semiconductor module.

12. The method as claimed in claim 11, the process of evaluating the voltage comprising comparing the voltage with at least one predefined threshold value.

13. The method of claim 11, the process of changing the system to the safe state comprising switching off the integrated semiconductor module.

14. The method of claim 11, the process of changing the system to the safe state comprising generating a warning signal.

15. A system for use in a safety-critical application, the system including:
a circuit part to be protected; and
an integrated circuit arrangement comprising:
    a first circuit part which can be supplied with a first supply voltage,
    a second circuit part which can be supplied with a second supply voltage,
    the first circuit part and the second circuit part being arranged in a manner spatially separate from one another,
    the first circuit part having a first conduction element,
    the second circuit part having a second conduction element, and
    a third conduction element, the third conduction element being electrically-isolated from and arranged between the first conduction element and the second conduction element in such a manner that the third conduction element is arranged adjacent to the first conduction element and the third conduction element is also arranged adjacent to the second conduction element, the third conduction element being able to be supplied with a reference potential at a first end, and the third conduction element being connected, at a second end, to an evaluation circuit that is electrically-isolated from the first conduction element and from the second conduction element for detecting a short circuit from the first conduction element to the third conduction element or from the second conduction element to the third conduction element, wherein the second conduction element of the integrated circuit arrangement is electrically coupled to the circuit part to be protected.

16. The system as claimed in claim 15, the system being designed in such a manner that it is changed to a safe state upon detection of the short circuit.

17. The system of claim 15, the system being designed in such a manner that destruction of the circuit part to be protected is prevented upon detection of the short circuit.

18. The system of claim 15, the safety-critical application comprising an application in a vehicle, and the system being designed in such a manner that failure of an airbag, a brake or a steering system is prevented upon detection of the short circuit.

19. The system of claim 15, the first conduction element of the integrated circuit arrangement being electrically coupled to an engine control circuit, and the circuit part to be protected having a microcontroller.

20. The system of claim 15, the integrated circuit arrangement and the circuit part to be protected being formed in a common integrated semiconductor module.

* * * * *